United States Patent
Feucht et al.

(10) Patent No.: US 9,797,961 B2
(45) Date of Patent: Oct. 24, 2017

(54) MAGNETIC FIELD SENSOR WITH DELAYED OUTPUT

(71) Applicant: Allegro MicroSystems, LLC, Worcester, MA (US)

(72) Inventors: Christian Feucht, Annecy (FR); Thomas J. Kovalcik, Barrington, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 93 days.

(21) Appl. No.: 14/599,789

(22) Filed: Jan. 19, 2015

(65) Prior Publication Data

US 2016/0209476 A1   Jul. 21, 2016

(51) Int. Cl.
| | | |
|---|---|---|
| *G01R 33/00* | (2006.01) | |
| *G01P 3/48* | (2006.01) | |
| *G01V 3/08* | (2006.01) | |
| *H03L 7/06* | (2006.01) | |
| *G01P 3/489* | (2006.01) | |

(52) U.S. Cl.
CPC ........ *G01R 33/0023* (2013.01); *G01P 3/4802* (2013.01); *G01P 3/489* (2013.01); *G01V 3/08* (2013.01); *H03L 7/06* (2013.01)

(58) Field of Classification Search
CPC ...................................................... G01R 33/02
See application file for complete search history.

(56) References Cited

U.S. PATENT DOCUMENTS

| | | | | |
|---|---|---|---|---|
| 4,555,765 A | * | 11/1985 | Crooke ................ | G01R 13/345 315/367 |
| 4,604,720 A | * | 8/1986 | Stikvoort ........... | H03H 17/0642 708/313 |

* cited by examiner

*Primary Examiner* — Kristal Feggins
*Assistant Examiner* — Kendrick Liu
(74) *Attorney, Agent, or Firm* — Daly, Crowley, Mofford & Durkee, LLP

(57) ABSTRACT

Apparatuses, systems, and methods that provide a delayed output signal with reduced sampling error are described. Embodiments include a clock circuit that generates a sample clock signal having a predetermined sample clock period. A sampling circuit may generate samples of a received signal during each sample clock period. An interpolation circuit may estimate a value of the received signal at times between the samples of the received signal based on at least a first sample and a second sample of the received signal. The interpolation circuit may estimate a time that the received signal crosses a threshold, and determine a time delta between the first sample and the estimated time that the received signal crosses the threshold. A delay circuit to generate a time delay substantially equal to the time delta is also included. An output signal changes state after the generated time delay.

18 Claims, 11 Drawing Sheets

MAGNETIC FIELD SENSOR WITH DELAYED OUTPUT

FIELD

This disclosure relates to sampling circuits and, more particularly, to magnetic field sensor circuits with a delayed output to reduce sampling error.

BACKGROUND

Magnetic field sensors including a magnetic field sensing element, or transducer, such as a Hall Effect element or a magnetoresistance element, are used in a variety of applications to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect a position of an engine crankshaft and/or camshaft, to detect position and/or rotation of transmission elements, and to detect a position and/or rotation of an automobile wheel for anti-lock braking systems.

The magnetic field sensor may, for example, detect a magnetic field that changes as the system operates or rotates and convert the detected magnetic field into an electrical signal for processing. As an example, the magnetic field sensor may provide an output signal having a transition or edge when the electrical signal crosses a threshold.

In many of these applications, the timing of the edge of the magnetic field detection (and the output signal) can be critical, especially in systems operating at high speed and/or systems where safety is important such as an anti-lock braking system for example. It can be important to precisely identify the time at which the electrical signal crosses the threshold. If the electrical signal is an analog signal, and the magnetic field sensor samples the analog signal at discrete time intervals, the threshold crossing will occur between samples, which can introduce sampling error and degrade the timing accuracy of the output signal.

SUMMARY

In an embodiment, a system includes a clock circuit that generates a sample clock signal having a predetermined sample clock period. A sampling circuit may generate samples of a received signal during each sample clock period. The system also includes an interpolation circuit for estimating a value of the received signal at times between the samples of the received signal based on at least a first sample and a second sample of the received signal. The interpolation circuit may estimate a time that the received signal crosses a predetermined threshold, and determine a time delta between the first sample and the estimated time that the received signal crosses the threshold. A delay circuit to generate a time delay substantially equal to the time delta is also included.

The system may also comprise one or more of the following features.

The delay circuit may be configured to generate the time delay during a clock period following the second sample.

A state transition of an output signal may be generated after the time delay.

An output of the delay circuit may have a resolution that is a fraction of the clock period. The resolution may be $½^x$ times the sample clock period, where x is a non-zero integer.

The delay circuit can include one or more inputs to receive one or more control signals representing the time delay. The one or more inputs may be digital inputs. A state machine may generate the one or more control signals.

The system may include a synchronization circuit to periodically synchronize the delay circuit so that a maximum delay generated by the delay circuit is substantially equal to the sample clock period. The synchronization circuit may comprise a control feedback loop, which may include a phase comparator and a variable current source.

In another embodiment, a magnetic field sensor includes a clock circuit that generates a sample clock signal having a predetermined sample clock period. A sampling circuit may generate samples of a received signal during each sample clock period. The system also includes an interpolation circuit for estimating a value of the received signal at times between the samples of the received signal based on at least a first sample and a second sample of the received signal. The interpolation circuit may estimate a time that the received signal crosses a predetermined threshold, and determine a time delta between the first sample and the estimated time that the received signal crosses the threshold. A delay circuit to generate a time delay substantially equal to the time delta is also included.

In another embodiment, a method for generating a delay includes generating a sample clock signal having a predetermined sample clock period. Samples of a received signal are generated during each sample clock period to produce a sampled signal. A value of the received signal is estimated at times between the samples of the received signal based on at least a first sample and a second sample of the received signal. A time that the interpolated signal crosses a threshold is identified, and a time delta between the first sample and the time that the interpolated signal crosses the threshold is determined. A delayed output signal having a state transition occurring at a time substantially equal to the time delta following the second sample is generated.

In another embodiment, a system includes a clock circuit that generates a sample clock signal having a predetermined sample clock period. A sampling circuit may generate samples of a received signal during each sample clock period. The system also includes an interpolation circuit for estimating a value of the received signal at times between the samples of the received signal based on at least a first sample and a second sample of the received signal. The interpolation circuit may estimate a time that the received signal crosses a predetermined threshold, and determine a time delta between the first sample and the estimated time that the received signal crosses the threshold. Means for generating a delayed output signal having a state transition during a second sample clock period following the first sample clock period are included to delay an output signal by a time substantially equal to the time delta during a clock period following the second sample.

Means for synchronizing the delay circuit so that a maximum delay generated by the delay circuit is substantially equal to the sample clock period may also be included.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more example embodiments. Accordingly, the figures are not intended to limit the scope of the invention. Like numbers in the figures denote like elements.

DETAILED DESCRIPTION

Figure 1:
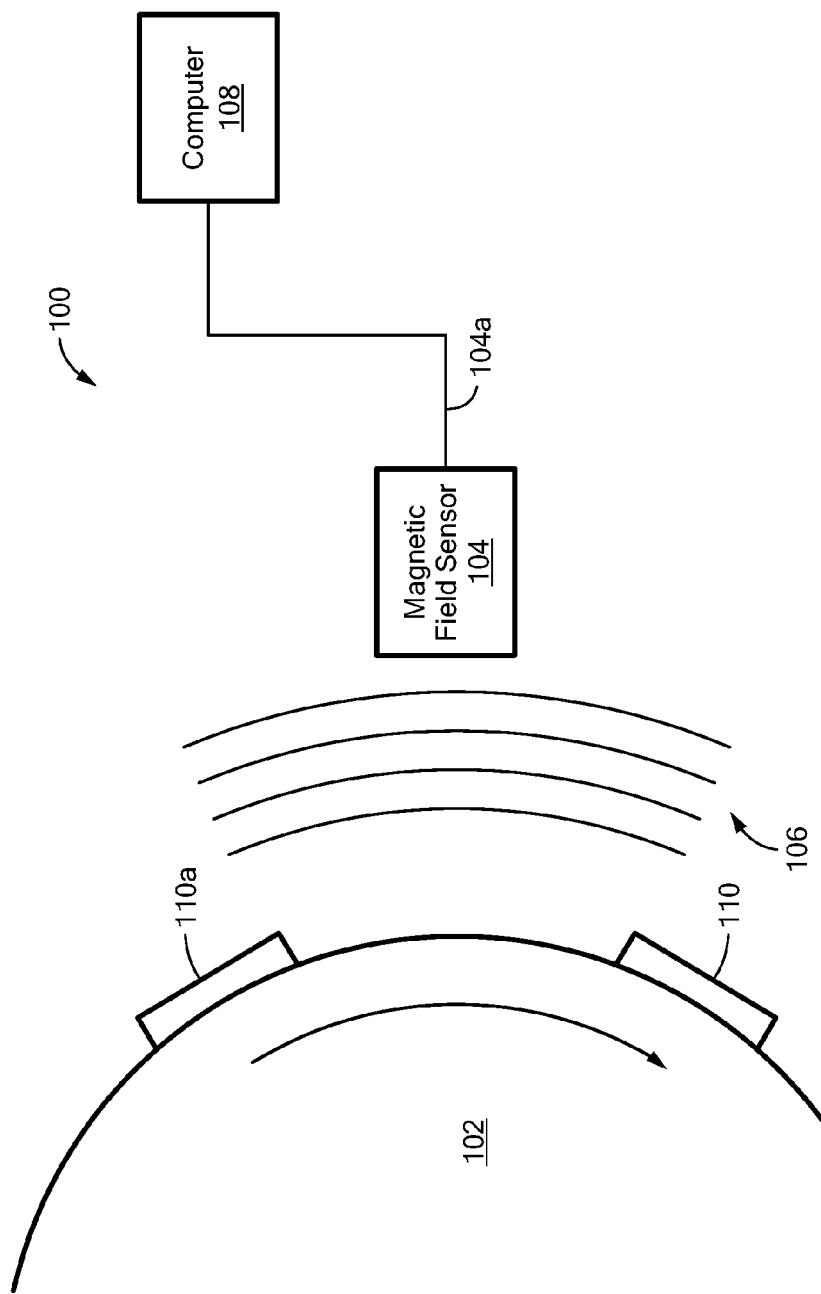
FIG. 1 is a block diagram of a system for detecting a magnetic target including a magnetic field sensor and a computer.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a e III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

As is known in the art, magnetic fields have direction and strength. The strength of a magnetic field can be described as magnetic flux or flux density. Therefore, the terms magnetic field "strength" and magnetic "flux" may be used interchangeably in this document.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1A:
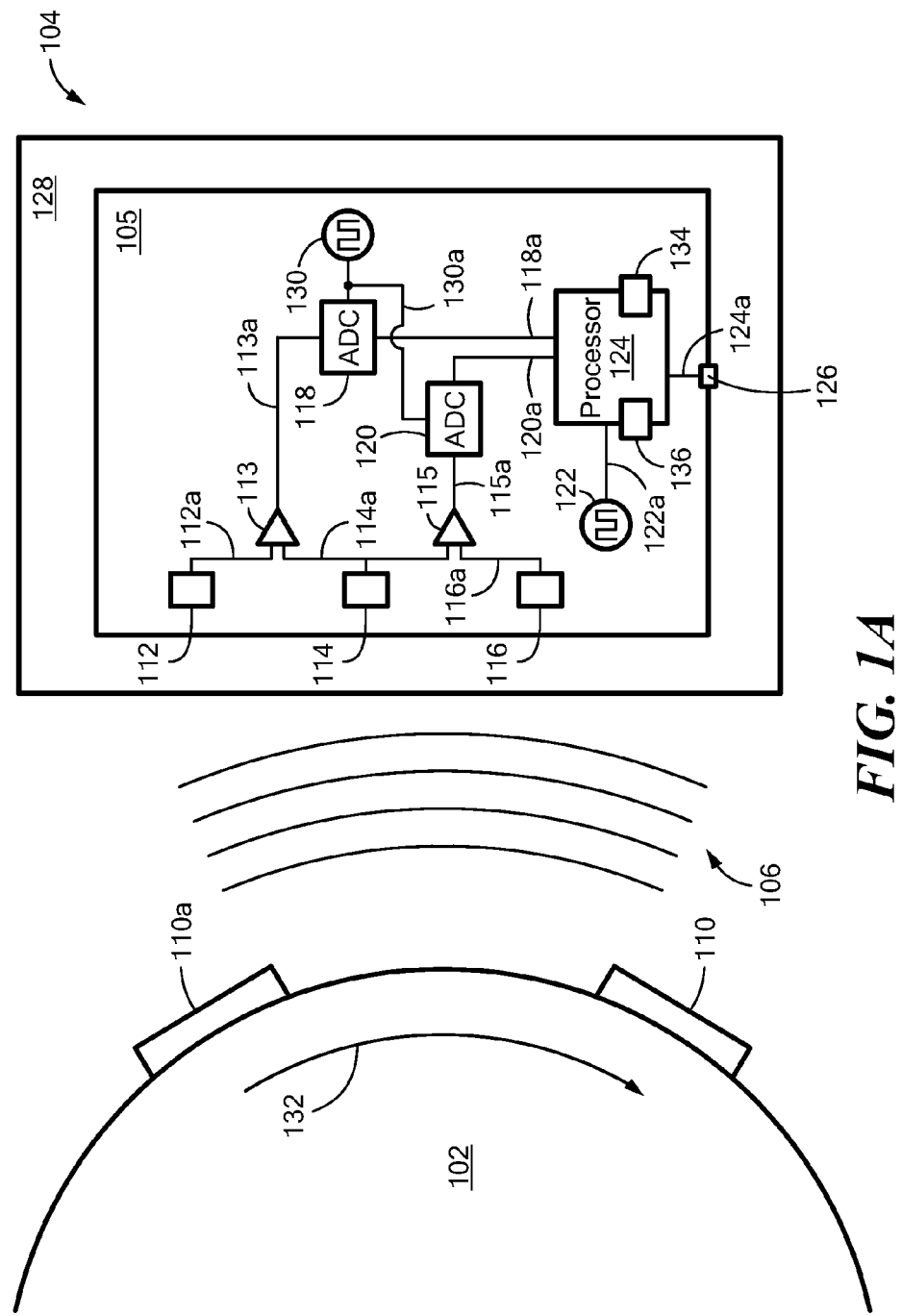
FIG. 1A is a block diagram of a system for detecting a magnetic target showing internal blocks of a magnetic field sensor.

FIG. 1 is a block diagram of a system 100 for detecting a target 102. System 100 includes a magnetic field sensor 104 placed adjacent to target 102 so that a magnetic field 106 can be sensed by magnetic field sensor 104. As shown in FIG. 1A, magnetic field sensor 104 may include one or more integrated circuits 105 supported by substrate 128. Although not shown, magnetic field sensor 104 may also include any appropriate package, lead frame, lead wires, etc. Also, magnetic field sensor 104 may include multiple substrates 128 that each support a portion of the circuits and other elements that comprise magnetic field sensor 104.

In an embodiment, target 102 is a magnetic target and produces magnetic field 106. In another embodiment, magnetic field 106 is generated by a magnetic source (e.g. a back-bias magnet or electromagnet) that is not coupled to target 102. In such embodiments, target 102 may be a ferromagnetic target that does not itself tend to generate a magnetic field. In the case where the target is a ferromagnetic target, as target 102 moves through or within magnetic field 106 generated by a back-bias magnet or electromagnet, it causes perturbations to magnetic field 106 that can be detected by magnetic field sensor 104.

Magnetic field sensor 104 may be coupled to a computer 108, which may be a general purpose processor executing software or firmware, a custom processor, or an electronic circuit for processing output signal 104a from magnetic field sensor 104. Output signal 104a may provide information about the speed and direction of target 102 to computer 108, which may then perform operations based on the received speed and direction. In an embodiment, magnetic field sensor 104 changes the state of output signal 104a when the detected magnetic field crosses a predetermined threshold.

In an embodiment, computer 108 is an automotive computer installed in a vehicle and target 102 is a moving part within the vehicle, such as a transmission shaft, a brake rotor, etc. Magnetic field sensor 104 detects the speed and direction of target 102 and computer 108 controls automotive functions (like all-wheel drive, ABS, etc.) in response to the detected speed and direction.

Target 102 can comprise any element capable of affecting magnetic field 106 through motion or proximity. For example, target 102 may be attached to a rotating shaft in an automotive transmission or brake system.

As shown in FIG. 1, target 102 may be a gear having teeth 110. As target 102 moves or rotates, teeth 110 affect magnetic field 106, which can be detected by magnetic field sensor 104. By detecting such changes to magnetic field 106, system 100 can determine speed and/or direction of target 102. Although shown as a rotating gear, target 102 can take on any form capable of being detected by magnetic sensor including, but not limited to: a toothed rack in a rack and pinion system; a gear; a gear with teeth, with magnets (e.g., a ring magnet), or other features on or attached to a shaft; etc. Also, although shown as separate elements, computer 108 and magnetic field sensor 104 may be part of the same circuit, part of the same integrated circuit, or contained in the same package.

Referring to FIG. 1A, magnetic field sensor 104 may include three magnetic field sensing elements 112, 114, and 116, which provide signals to differential amplifiers 113 and 115. The outputs 113a and 115a of the differential amplifiers are received by analog-to-digital converters (ADCs) 118 and 120, respectively. In the embodiment shown, ADC 118 and ADC 120 may take discrete time samples of signals 113a and 115a and provide a discrete time digital signals 118a and 120a to processor 124. ADC 118 and 120 may receive a sample clock signal 130a from sample clock 130. The sample clock signal 130a may trigger sampling by the ADCs 118, 120.

As shown, magnetic field sensor 104 includes one or more magnetic field sensing elements 112, 114, 116. Magnetic field sensing elements 112, 114, 116 are positioned adjacent to target 102 to detect magnetic field 106. Each magnetic field sensing element provides a respective output signal 112a, 114a, or 116a, which represent the magnetic field as detected by magnetic field sensing element 112, 114, and 116, respectively. Magnetic field sensing elements 112, 114, and 116 may be Hall Effect elements, magnetoresistive elements, or other types of magnetic field sensing elements.

Differential amplifier 113 receives signal 112a and 114a, and differential amplifier 115 receives signals 114a and 116a. The output of differential amplifier 113 corresponds to a position of target 102 in relation to magnetic field sensing elements 112 and 114. Similarly, the output of differential amplifier 115 may correspond to a position of target 102 in relation to magnetic field sensing elements 114 and 116. Signals 113a and 115a are received by ADC 118 and ADC 120, respectively. Although not shown in FIG. 1A, magnetic field sensor 104 may include filters or other signal-shaping circuits to condition and shape signals 113a and/or 115a prior to them being received by ADCs 118 and 120.

Processor 124 may be a circuit that processes signals 118a and 120a, and may provide output signal 124a. Signals 118a and 120a may represent detection of passing features, e.g., gear teeth, of magnetic target 102. Thus, processor 124 may process these signals and provide output signal 124a so that output signal 124a carries information about magnetic target 102, such as speed, direction, etc.

Processor 124 may be a circuit specifically designed to process signals 118a and 120a and/or to perform other functions. In another embodiment, processor 124 is a general purpose or custom processor executing software, firmware, micro-code, or any other type of executable instructions in order to process signals 118a and 120a and/or to perform other functions.

In an embodiment, processor 124 includes an interpolation circuit 134 configured to interpolate between samples of discrete time signals 118a and 120a. As is known, interpolation is the estimation of a value between two points in a series, based on one, two, or more points within the series. Thus, interpolation circuit 134 may be configured to estimate a value of signal 118a and/or 120a between samples of signal 118a and/or 120a based on two or more of the samples that comprise signal 118a and/or 120a.

Similar to processor 124, interpolation circuit 124 may be a custom circuit or a general purpose processing circuit that executes instructions. In another embodiment, if processor 124 is a processor that executes instructions, interpolation circuit 134 may be replaced by instructions that cause processor 124 to perform interpolations based on signal 118a and/or 120a.

Processor 124 may also include a delay circuit 136 to generate a delay, discussed below in greater detail. Similar to interpolation circuit 134, delay circuit 136 may be a custom circuit, a processor configured to generate a delay, or may be implemented as instructions which, when executed by processor 124, cause a delay. In the example shown in FIG. 1A, interpolation circuit 134 and delay circuit 136 are part of processor 124. However, this is not a requirement. Interpolation circuit 134 and delay circuit 136 may be separate from processor 124, integrated into the ADCs 118 and/or 120, or may be incorporated in other arrangements within magnetic field sensor 104.

The embodiment shown in FIG. 1A includes three magnetic field sensing elements with differential amplifiers. However, other arrangements are possible. For example, if the differential amplifiers are removed, magnetic field sensor 104 may have two magnetic field sensing elements, each coupled to one of the ADCs. In this embodiment, one of the magnetic field sensing elements may provide signal 113*a* to ADC 118, and the other magnetic field sensing element may provide signal 115*a* to ADC 120. Other arrangements having one magnetic field sensing element (and one ADC) or more than three magnetic field sensing elements can also be used.

One skilled in the art will note that, if sensor 104 includes only one magnetic field sensing element, such as magnetic field sensing element 112, and teeth 110 are regularly spaced and shaped, then sensor 104 may be able to detect only speed, e.g., of rotation, of target 102 by counting (for example) the times that teeth 110 and 110*a* are detected over a particular time period. However, if sensor 104 contains more than one magnetic field sensing element, sensor 104 can also detect direction, e.g., of rotation, by measuring a phase between the signals, e.g., 113*a*, 115*a*. of the magnetic field sensing elements. In the embodiment shown in FIG. 1A, sensor 104 can detect speed by measuring the number of times signal 113*a* and/or 115*a* indicates that a tooth was detected over a particular time period. Additionally or alternatively, sensor 104 can detect the direction of target 102 by measuring the phase between signals 113*a* and 115*a*. It will be understood that speed and/or direction information can be encoded in the output signal 124*a* in a variety of ways.

Magnetic field sensor 104 can include an oscillator 122 that provides an oscillating output 122*a*. Oscillator 122 may be non-crystal oscillator circuit (or a crystal oscillator circuit) and oscillating output 122*a* may be used as a clock signal. Magnetic field sensor 104 may also include an oscillator 130, which may be a crystal or non-crystal oscillator, that provides an oscillating output 130*a* to ADC 118 and ADC 120. The oscillating output 130*a* may be a sample clock that triggers sampling by ADCs 118 and 120. Although not shown, sample clock signal 130*a* may also be received by processor 124. In an embodiment, each ADC may be coupled to separate oscillator circuits (not shown).

Signals 118*a* and 120*a* are received by processor circuit 124, which uses signals 118*a* and 120*a* to compute speed and/or direction of target 102. Processor 124 provides output signal 124*a*, which may be coupled to output port 126 so that signal 124*a* can be received by an external circuit (e.g. by automotive computer 108 in FIG. 1). Output signal 124*a* may be the same as or similar to signal 104*a* shown in FIG. 1.

In operation, magnetic target 102 moves or rotates relative to magnetic field sensor 104. The relative movement causes changes or perturbations to magnetic field 106, which are detected by magnetic field sensing elements 112, 114, and/or 116. When the magnetic field sensed by magnetic field sensing element 112 is relatively strong, the voltage (or current) level of signal 112*a* will be relatively high. Likewise, when the magnetic field sensed by magnetic field sensing elements 114 and 116 is relatively strong, the voltage (or current) levels of signals 114*a* and 116*a* will be relatively high. Magnetic field sensing elements 112, 114, and 116 can also be configured so that the signals 112*a*, 114*a*, and 116*a* are relatively low when the magnetic field sensing elements detect a relatively strong magnetic field.

As teeth 110 and 110*a* move relative to the magnetic field sensing elements, the magnetic field sensing elements detect changes in magnetic field 106. As tooth 110*a* rotates first past magnetic field sensing element 112 in the direction of arrow 132, signal 112*a* indicates that a tooth is detected. Subsequently, as tooth 110*a* moves past magnetic field sensing element 114, signal 114*a* indicates that a tooth is detected. Likewise, as tooth 110*a* rotates past magnetic field sensing element 116, signal 116*a* indicates that a tooth is detected.

Differential amplifier 113 receives signals 112*a* and 114*a* and generates signal 113*a*, which represents a voltage difference between signals 112*a* and 114*a*. Similarly, differential amplifier 115 provides signal 115*a*, which represents a voltage difference between signals 114*a* and 116*a*. ADC 118 then samples and signal 113*a* and converts it to digital signal 118*a*, and ADC 120 samples signal 115*a* and converts it to digital signal 120*a*. Digital signals 118*a* and 120*a* are received by processor 124, which processes the signals to determine speed and direction of target 102 and to generate output signal 124*a*.

In an embodiment, processor 124 is configured to determine when signals 118*a* and 120*a* cross respective predetermined thresholds, the crossings of which may indicate that tooth 110 or 110*a* has been detected. Processor 124 may then produce output signal 124*a* to carry information about the speed and direction and/or information about whether a tooth 110 or 110*a* was detected, to an external circuit or processor for subsequent processing. In embodiments, processor 124 can also indicate an error condition, e.g., by altering a voltage level of signals 124*a*. For example, processor 124 may generate a DC offset on signal 124*a*, which can be received by external circuitry, to indicate an error condition.

In an embodiment, signal 118*a* and signal 120*a* are digital representations of analog signals 113*a* and 115*a*. In such an embodiment, if signals 118*a* and 120*a* are plotted on a graph, the shape, amplitude, and timing of signals 118*a* and 120*a* generally comports to the shape, amplitude, and timing of signals 113*a* and 115*a*.

Figure 2:
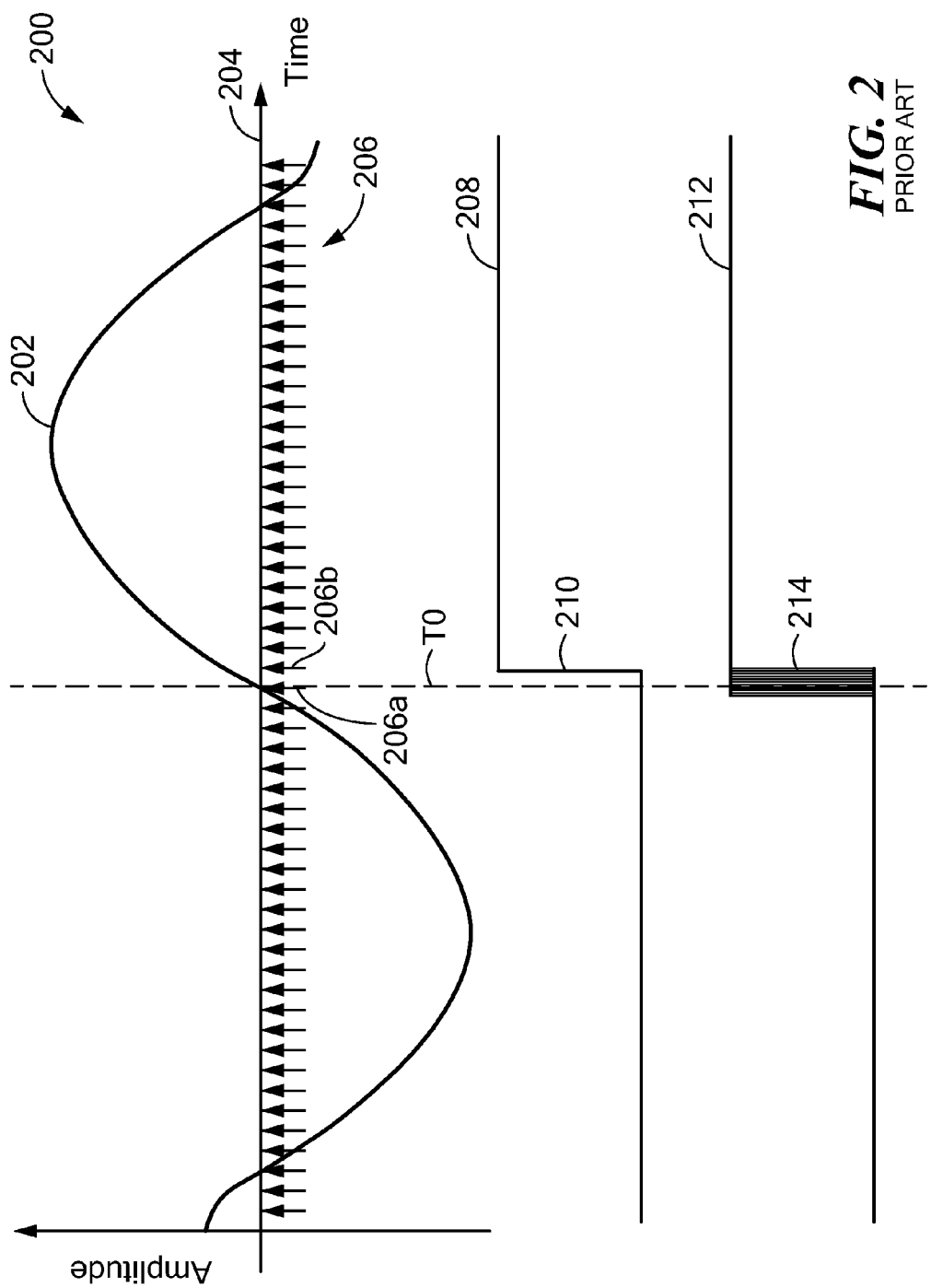
FIG. 2 is a timing diagram of a magnetic field signal.

Turning to FIG. 2, a graph 200 illustrates sampling error that can be introduced in sampling systems of the prior art. A horizontal axis represents time in arbitrary units and a vertical axis represents voltage in arbitrary units. (In other examples, the vertical axis may represent other measureable signal attributes such as current, power, etc.). Signal 202 is an analog signal that is received by a discrete time sampling circuit. Waveform 202 may be similar to signal 113*a* or 115*a*, for example. Arrows 206 represent times at which signal 202 is sampled. As shown, signal 202 crosses threshold 204 at time T0, a time just after sample 206*a* is taken. Thus, the threshold crossing is not detected until the next sample 206*b* is taken.

Signal 208 is an output signal generated when the threshold crossing is detected. State transition 210 from low to high indicates the crossing. Even though the threshold crossing occurred prior to sample 206*b*, the prior art system does not detect the crossing and change the state of output signal 208 until sample 206*b* is taken.

Signal 212 is an overlay of multiple, ideal signals that represent actual threshold crossings between samples 206*a* and 206*b*. For example, in an operating magnetic field sensor, on other cycles of the signal 202, the threshold crossings can occur at any time between samples. Thus, some crossings may occur closer in time to sample 206*a* and others may occur closer in time to 206*b*. Accordingly, if many crossings are overlaid onto the same graph, the crossings will be distributed between sample 206*a* and 206*b* as shown by bar 214. Because the prior art system can only detect the crossing once sample 206b is taken, the output will change state only at the time of sample 206b. Thus, for any one cycle of the signal 202, there is a non-deterministic error between the time the actual crossing occurs and the time the output changes state to indicate that a crossing occurred. This error can be represented as: $T_{ERR}=T_{SAMPLE}-T_{CROSSING}$, where $T_{ERR}$ is the error, $T_{CROSSING}$ is the time at which the actual crossing occurred, and $T_{SAMPLE}$ is the time of the next sample taken after the crossing occurred. Note that the overlay as shown in signal 212 may be similar to a so-called eye diagram or eye pattern function of an oscilloscope.

Figure 3:
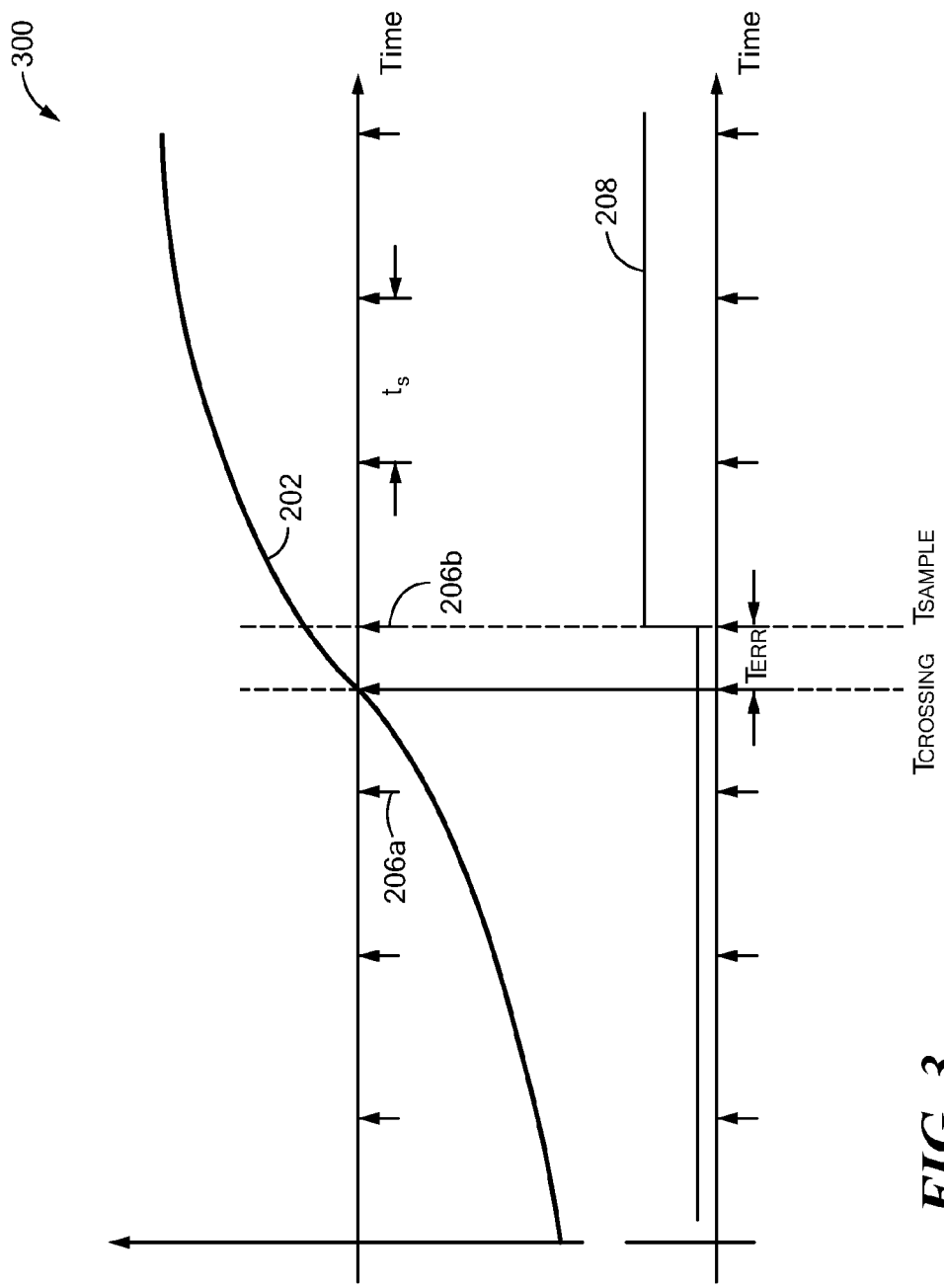
FIG. 3 is a timing diagram of a magnetic field signal showing time between threshold crossing and sampling.

Referring to FIG. 3, a graph 300 illustrates the non-deterministic error $T_{ERR}$. FIG. 3 zooms in on waveforms 202 and 208 from FIG. 2 in order to provide an illustration of $T_{ERR}$.

As shown in FIG. 3, even though signal 202 crosses the threshold at time $T_{CROSSING}$, signal 208 does not change state until the time sample 206b is taken at time $T_{SAMPLE}$. The difference between $T_{CROSSING}$ and $T_{SAMPLE}$ is the error $T_{ERR}$. Note that $T_{ERR}$ must be less than the period $t_s$ of the sample clock.

Figure 4:
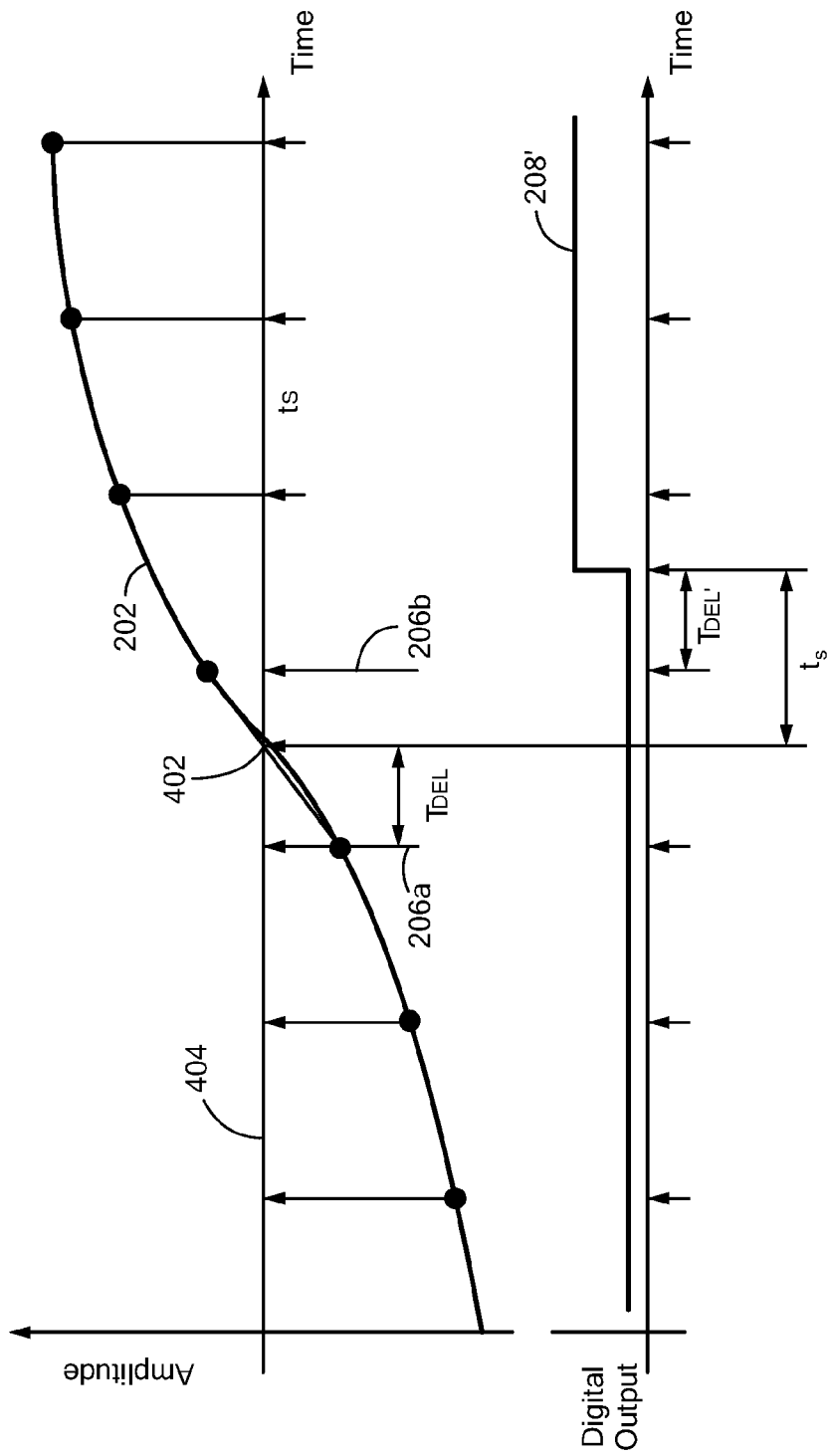
FIG. 4 is a timing diagram of a magnetic field signal showing a delayed output signal.

In FIG. 4, graph 400 illustrates the addition of a variable and calculated delay to reduce or minimize error $T_{ERR}$, and to reduce or minimize the above described sampling error. In an embodiment, a clock circuit (e.g. clock circuit 130 in FIG. 2) generates a sample clock having a predetermined sample period $t_S$. A sampling circuit (ADC 118 and/or 120 for example) generates samples (e.g. samples 206a and 206b) of signal 202 during each sample clock period. Interpolation circuit 134 may estimate the value of signal 202 at point 402, between samples 206a, 206b, where signal 202 crosses predetermined threshold 404 and may identify a time at which signal 202 crosses threshold 404. Processor 124 (or another circuit) may then determine a time delta $T_{DEL}$ between sample 206a and sample 206b. The time delta $T_{DEL}$ may be an estimate of the time between sample 206a and threshold crossing at point 402. Delay circuit 134 may then generate a delay $T_{DEL}'$ after sample 206b, which may be approximately equal to $T_{DEL}$, prior to output signal 208 changing state to indicate detection of magnetic target 102.

As shown in FIG. 4, sample 206b is the sample immediately following the threshold crossing at point 402. In an embodiment, magnetic field sensor will generate the delay $T_{DEL}'$ during the clock period following sample 206b as shown. After $T_{DEL}'$, magnetic field sensor 104 may generate a state transition of output signal 208' (as shown by signal 208' transitioning from a low voltage state to high voltage state, for example) to indicate detection of magnetic target 102. The state transition may be generated by processor 124 or by another circuit such as an output driver circuit (not shown).

In an embodiment, in order to estimate the time delay $T_{DEL}$ (and $T_{DEL}'$), interpolation circuit 136 may perform a linear interpolation between samples 206a and 206b. In this case, $T_{DEL}$ may be computed by the following formula:

$$T_{DEL} = \frac{(V_T - V_1)(t_s)}{V_2 - V_1}$$

In the formula above, $T_{DEL}$ is the delay, $V_T$ is the value of threshold 404, $V_1$ is the value of sample 206a, $V_2$ is the sample 206b, and $t_S$ is the sample clock period. It should be recognized that the estimated time delay $T_{DEL}$ (and $T_{DEL}'$) can be different for each different cycle (or different zero crossing) of the signal 202.

Interpolation circuit 136 may also perform a linear interpolation based on other, non-adjacent samples if desired. In other embodiments, interpolation circuit 136 may perform higher order interpolation based on more than two samples in order to determine $T_{DEL}$.

Figure 5:
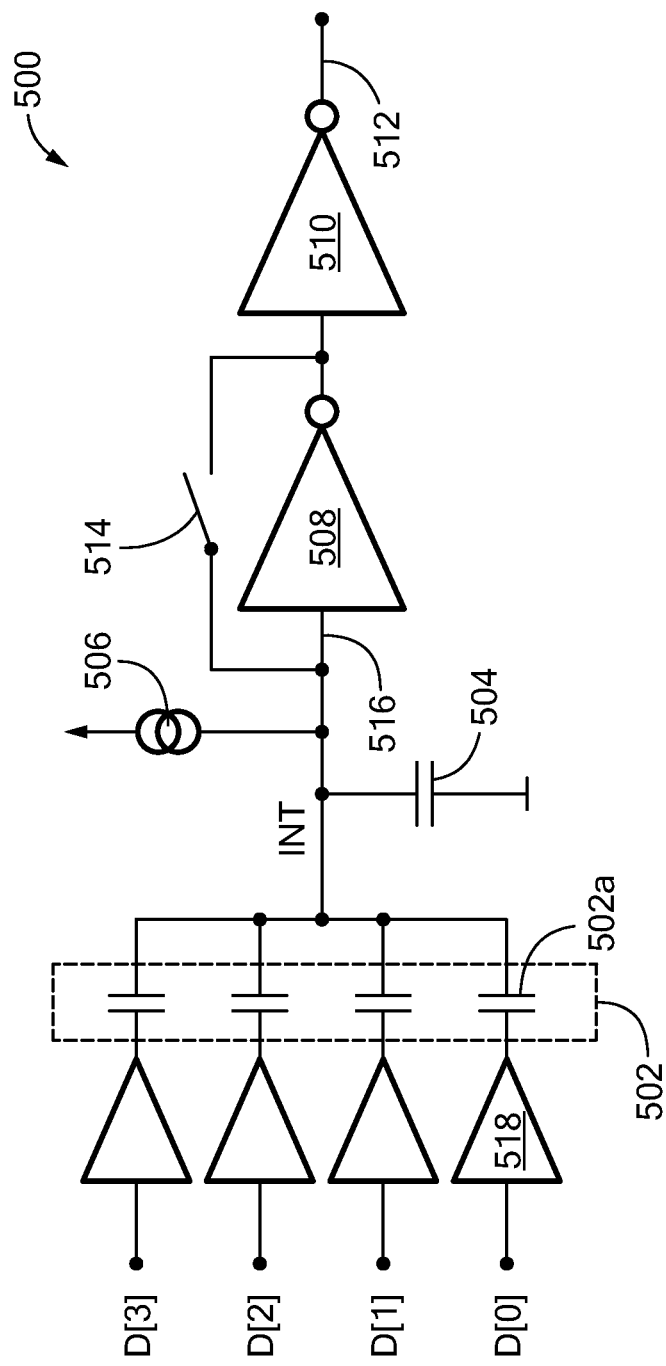
FIG. 5 is a circuit diagram of a delay circuit.

Turning to FIG. 5, a delay circuit 500 is configured to generate the delay $T_{DEL}'$. Delay circuit 500 may be the same as or similar to delay circuit 136 in FIG. 1A. Delay circuit 500 can include a plurality of capacitors 502 that may be charged or discharged based on the value of a corresponding control line D[0], D[1], D[2], or D[3]. These control lines may be coupled to processor 124, for example, which may drive control signals onto the control lines. In an embodiment, processor 124 may include a state machine circuit for controlling and driving the control lines. Although four capacitors and control lines are shown, delay circuit 500 may have more than or fewer than three capacitors and control lines. In an embodiment, delay circuit 500 includes three control lines.

Delay circuit 500 can also include a charging capacitor 504 and a current source 506. Buffers 508 and 510 (which may be inverters or comparators, for example) can be connected in series to provide output signal 512. A reset switch 514 may be included to reset the circuit and drain any charge from charging capacitor 504 and/or capacitors 502. Output signal 512 may be the same as or similar to signal 124a in FIG. 1 and/or signal 208' in FIG. 4. Also, switch 514 may be a transistor, a gate, or any other type of electronic switch that can be implemented, for example, in an integrated circuit.

In operation, the delay $T_{DEL}'$ is generated by the charging time of the capacitors 502 and 504. When circuit 500 is active, current source 506 provides a predetermined current to charging capacitor 504 and capacitors 502. As charge flows into the capacitors, the voltage across charging capacitor 504 (i.e. the voltage at the input 516 of buffer 508) will increase. When the voltage at input 516 increases past the switching threshold of buffer 508, buffer 508 will switch, causing buffer 510 to switch and generate a state change of the output signal 512.

In an embodiment, circuit 500 may be configured so that the time it takes to charge the capacitors 502 and 504 (i.e. the maximum delay time) is approximately equal to the period ts of the sampling clock (e.g. sample clock 130 in FIG. 1A). However, the delay of circuit 500 can be controlled with the control lines D[0]-D[3]. For example, if D[0] is high, then buffer 518 will provide a high voltage to the left side of capacitor 502a, which may provide an initial charge to charging capacitor 504 and reduce the time necessary for current source 506 to charge the capacitors, thus reducing the delay time $T_{DEL}'$ from the maximum. Enabling and disabling the control lines can control the delay time as desired. In an embodiment, the minimum resolution, i.e. the smallest incremental delay that can be generated by delay circuit 500, is a fraction of the sampling period. Thus, delay circuit 500 can produce a controllable delay that is less than $t_S$. In an embodiment, the resolution of the delay circuit (i.e. the minimum change in delay that circuit 500 can make to alter the delay time) is $\frac{1}{2}^x$ times the sample clock period, where x is the number of control lines that control the delay time. In other embodiments, e.g. embodiments that utilize other types of delay circuits, the resolution can be any fraction of the sample clock period.

As described above, processor 124 may be able to calculate the delay time $T_{DEL}$ between the first sample and the time that signal 202 crosses the threshold. Once $T_{DEL}$ is estimated by interpolation circuit 134, processor 124 may assert control lines D[0]-D[3] so that the delay $T_{DEL}'$ generated by delay circuit 500 is approximately equal to $T_{DEL}$. This may cause delay circuit 500 to change the state of output signal 512 after a time delay $T_{DEL}'$ following the clock cycle or next sample (e.g. following sample 206*b*). In an embodiment, the delay can follow the next sample, or any predetermined number of subsequent samples so as to increase the delay if desired.

Figure 6:
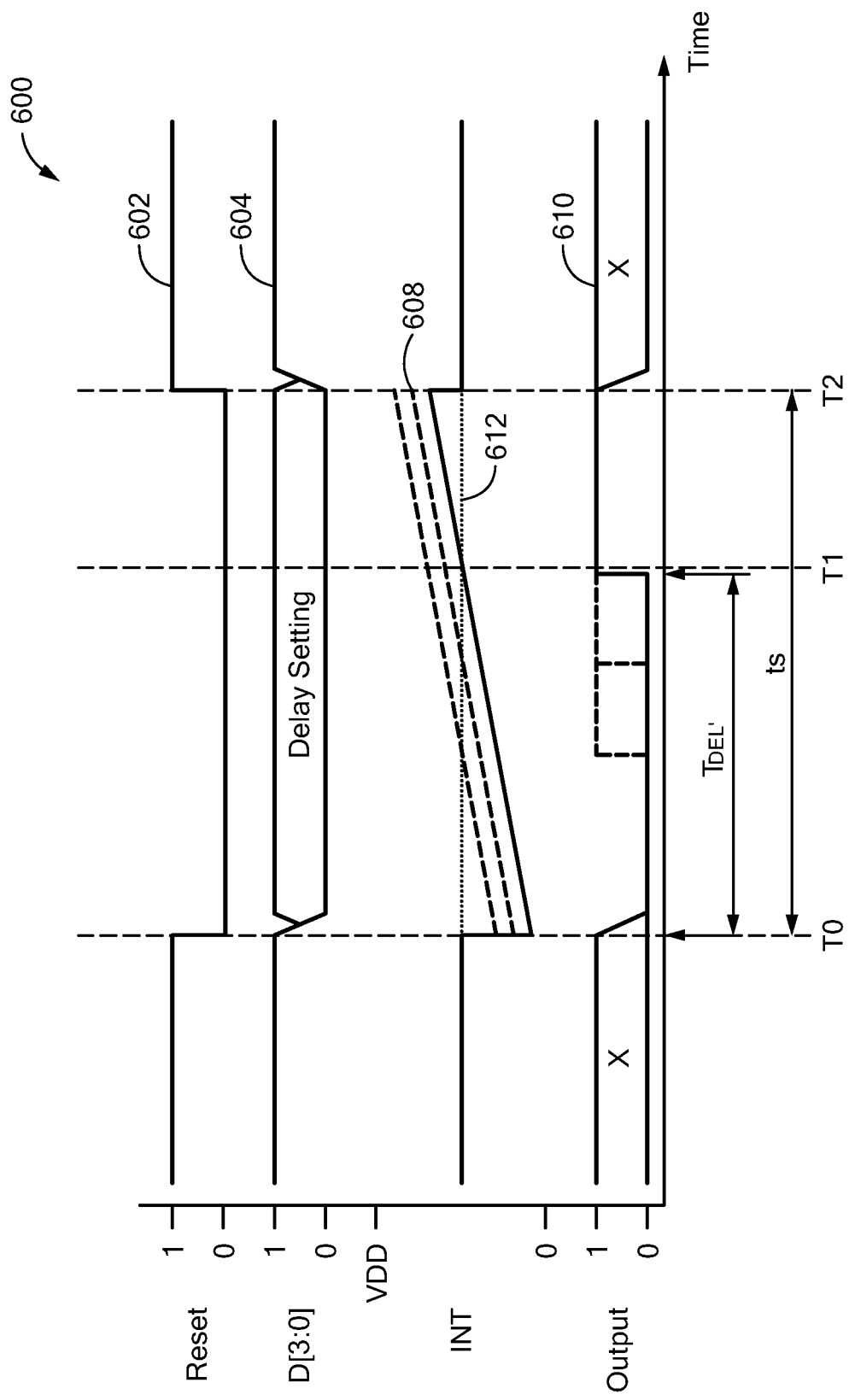
FIG. 6 is a timing diagram of signals associated with the delay circuit of FIG. 5.

Referring also to FIG. 6, a graph 600 shows signals associated with delay circuit 500. From top to bottom are: the reset signal (represented by waveform 602), digital control signals D[0]-D[3] (represented by waveform 604), the voltage at input node 516 (represented by waveform 606), and output signal 512 (represented by waveform 608). Time T0 may correspond to the beginning of a sample clock period that follows the threshold crossing (i.e. T0 may correspond to sample 206*b* in FIG. 4).

At time T0 the reset signal is released and delay circuit 500 comes out of reset. Processor 124 may drive the signal lines D[0]-D[3] so that delay circuit 500 generates the appropriate delay $T_{DEL}'$. At time T1 the voltage at input node 516 crosses switching threshold 612 of buffer 508 (FIG. 5), causing the output signal 512 to change state. At time T2 the next sample period begins and the reset signal is driven to reset delay circuit 500 via switch 514.

Figure 7:
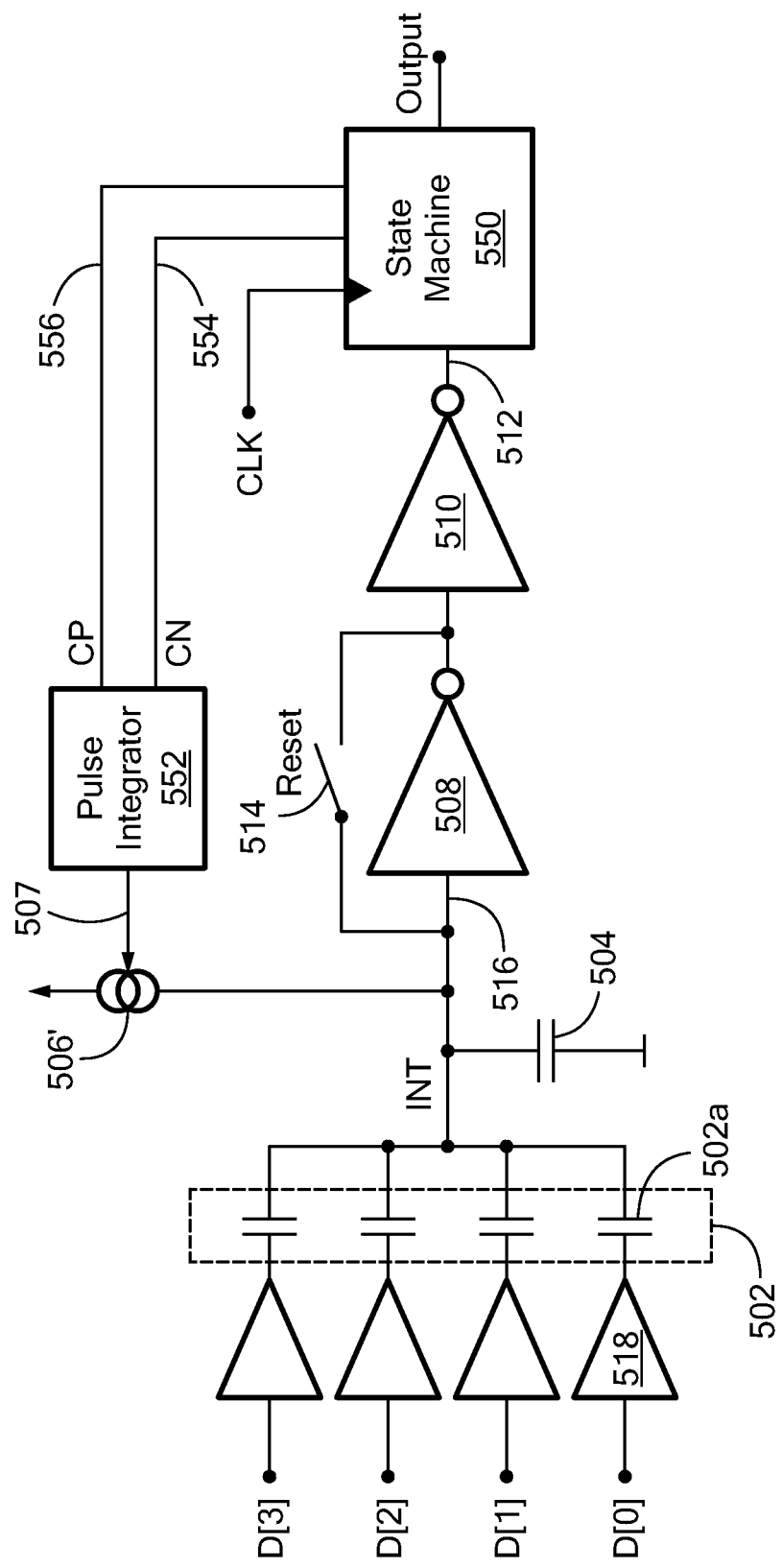
FIG. 7 is a circuit diagram of a delay circuit including synchronization features.

Referring now to FIG. 7, a delay circuit 500' is shown. Delay circuit 500' may be the same as or similar to delay circuit 136 in FIG. 1A.

As shown, delay circuit 500' is similar to delay circuit 500 but adds a state machine circuit 550 and a pulse integrator circuit 552 to control the current source 506'. The state machine circuit 550 may implement or act as a phase comparator circuit to determine if the delay time generated by delay circuit 500 is in phase or out of phase with (or, in other words, leading or lagging) the sample clock period $t_S$. Current source 506' may be a variable current source controlled by output 507 of pulse integrator 552. The state machine circuit 550 and pulse integrator circuit 552 may form a control loop that can be used to calibrate the delay of circuit 500' so that the maximum delay of delay circuit 500' is substantially equal to the sample clock period $t_S$.

The example circuits 500 and 500' each provide a discrete number of possible delay times. It should be noted that circuits 500 and 500' may be replaced by other circuits that can provide non-discrete delays.

Figure 8:
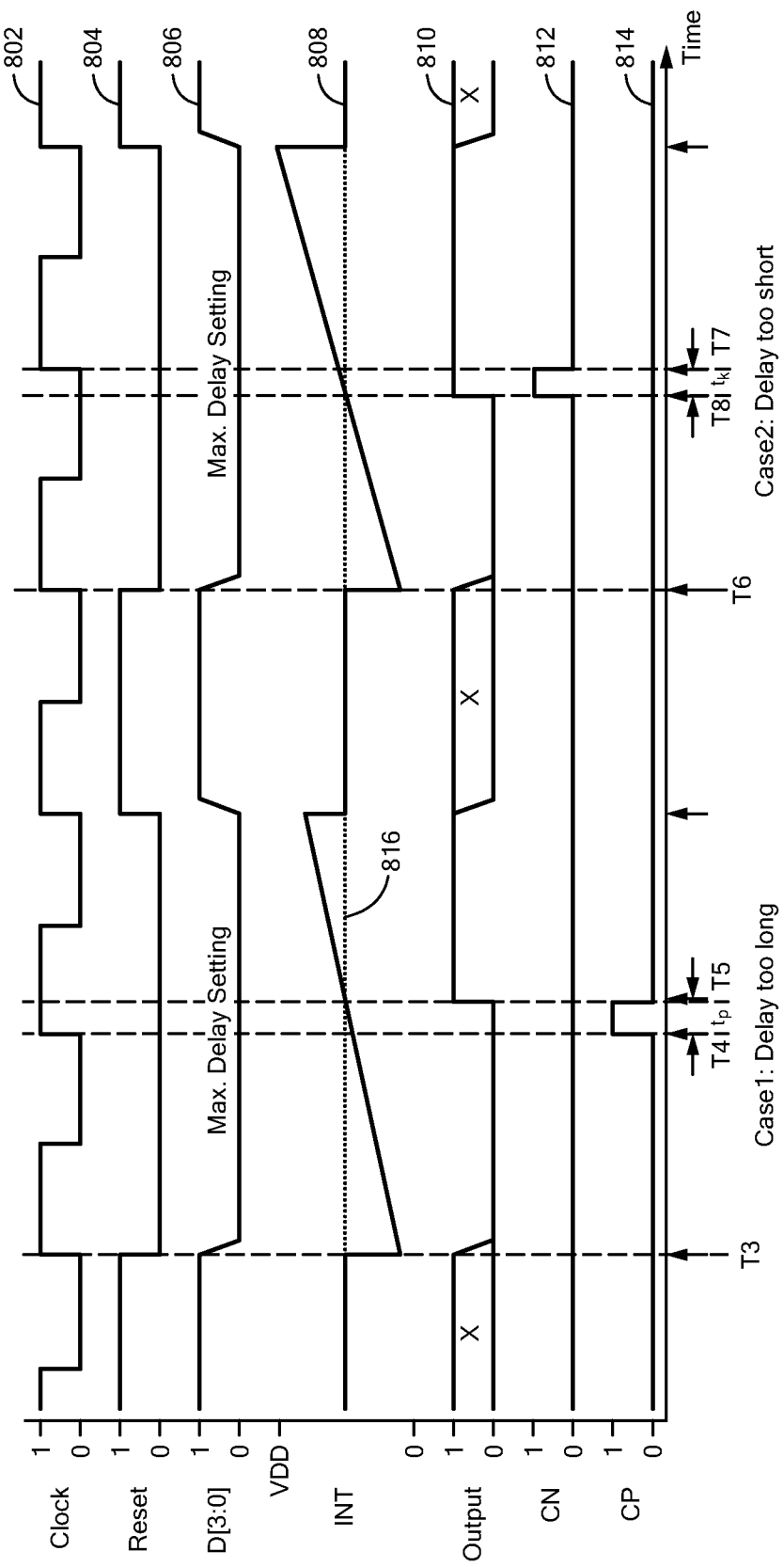
FIG. 8 is a timing diagram of signals associated with the delay circuit of FIG. 7.

FIG. 8 illustrates operation of circuit 500' to synchronize the maximum delay time. In FIG. 8, waveform 802 represents the sample clock, waveform 804 represents the reset signal, waveform 806 represents the control lines D[0]-D[3], waveform 808 represents the voltage at input node 516, waveform 810 represents the output signal 512, waveform 812 represents state machine output 554, and waveform 814 represents state machine output 556.

To calibrate circuit 500', the control lines D[0]-D[3] are driven low so that circuit 500' produces the maximum delay. At time T3, reset is released and current source 506' begins charging the capacitors. If properly calibrated, the voltage at node 516 should cross the switching threshold 816 of the buffer at the end of the clock period at time T4. However, if the voltage at node 516 crosses threshold 815 at time T5 (as shown in FIG. 8), then the delay produced by circuit 500' may be too long. In this case, circuit 500' can drive a pulse on signal 556 to increase the current generated by current source 506' and reduce the maximum delay of delay circuit 500'.

Looking at another case, at time T6 reset is again released and current source 506' begins charging capacitor 504. If properly calibrated, the voltage at node 516 should cross the switching threshold 816 of buffer 508 at the end of the clock period at time T7. However, if the voltage at node 516 crosses threshold 815 at time T8 (as shown in FIG. 8), then the delay produced by circuit 500' may be too short. In this case, circuit 500' can drive a pulse on signal 554 to decrease the current generated by current source 506' and increase the maximum delay of delay circuit 500'.

In an embodiment, circuit 500' may be calibrated repeatedly, during clock cycles where the new transitions of the output of circuit 500' are not needed (i.e., between zero crossings), so that in the presence of changes in temperature or other external stimulus, the maximum delay generated by circuit 500' remains substantially equal to the clock period $t_S$.

Figure 9:
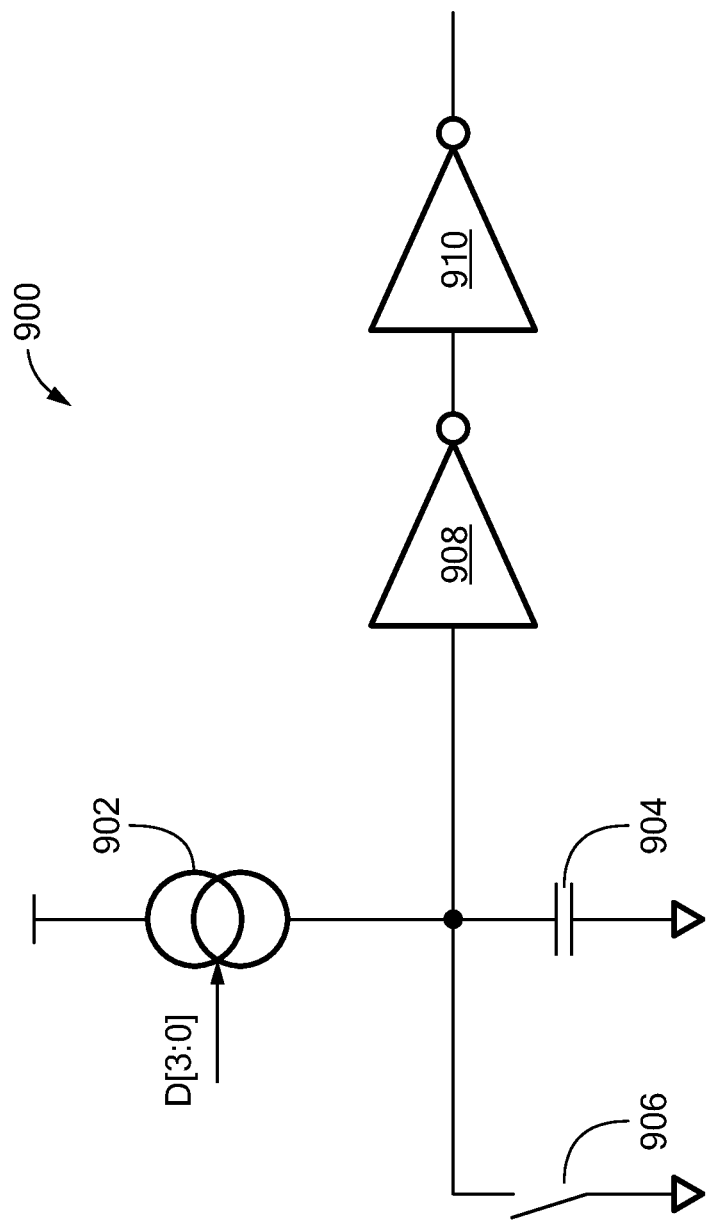
FIG. 9 is a circuit diagram of a delay circuit.

Referring to FIG. 9, a delay circuit 900, which may be the same as or similar to delay circuit 136 in FIG. 1A, is configured to generate the delay $T_{DEL}'$ by controlling the current of variable current source 902. Variable current source 902 may be controlled directly or indirectly by control lines D[0]-D[3]. Delay circuit 900 also includes charging capacitor 904 coupled to the output of variable current source 902 and ground, a reset switch 906 coupled in parallel to capacitor 904, and buffers 908 and 910. In embodiments, reset switch 906 may be a transistor or any other type of switching element and buffers 908 and 910 may be inverters, buffers, comparators, or any other type of buffer.

When reset switch 906 is closed circuit 900 is in reset and capacitor 904 is drained of charge so there is no voltage across capacitor 904. While circuit 900 is in reset, variable current source 902 may be turned off so that it does not produce current.

When reset switch 906 opens and variable current source 902 is turned on, current will flow from variable current source 902 into capacitor 904. As capacitor 904 charges, the voltage across capacitor 904 will rise. Once the voltage rises above the switching threshold of buffer 908, the output of buffer 908 (and buffer 910) will change state.

Changing the amount of current produced by variable current source 902 may change the delay time $T_{DEL}'$. Increasing the amount of current (e.g. by changing the value of control lines D[0]-D[3]) may charge capacitor 904 more quickly and result in a shorter delay time. Conversely, decreasing the amount of current produced by variable current source 902 may charge capacitor 904 more slowly and result in a longer delay time. Thus, processor 124, by driving the control lines, can control circuit 900 to produce a delay time $T_{DEL}'$ that is substantially equal to the estimated delay time $T_{DEL}$.

In certain precise timing applications, using the inherent input threshold of buffer 908 (or buffer 508) as a timing trigger without adjustment may be inaccurate. For example, variables in the manufacturing process may shift the input threshold of buffer 908 up or down so that the input threshold varies between parts or between circuits. Thus, circuit 900 can include a feedback loop the same as or similar to the state machine 550 and pulse integrator 552 feedback loop shown in circuit 500'. Additionally or alternatively, buffer 900 may be designed with the same type of reference input (i.e. gate input) as the oscillator (e.g. oscillator 130) so that any manufacturing variables apply to both the oscillator and buffer. This may minimize differences between thresholds of the oscillator and buffer and minimize or eliminate timing inaccuracies due to the input threshold of the buffer.

Delay circuits 500, 500', and 900 are provided an examples. Any circuit that provides a controllable delay can be used to generate $T_{DEL}'$. In other embodiments, $T_{DEL}'$ may be generated by a digital timer circuit, a resistor-capacitor charging circuit with a variable resistance, etc.

Figure 10:
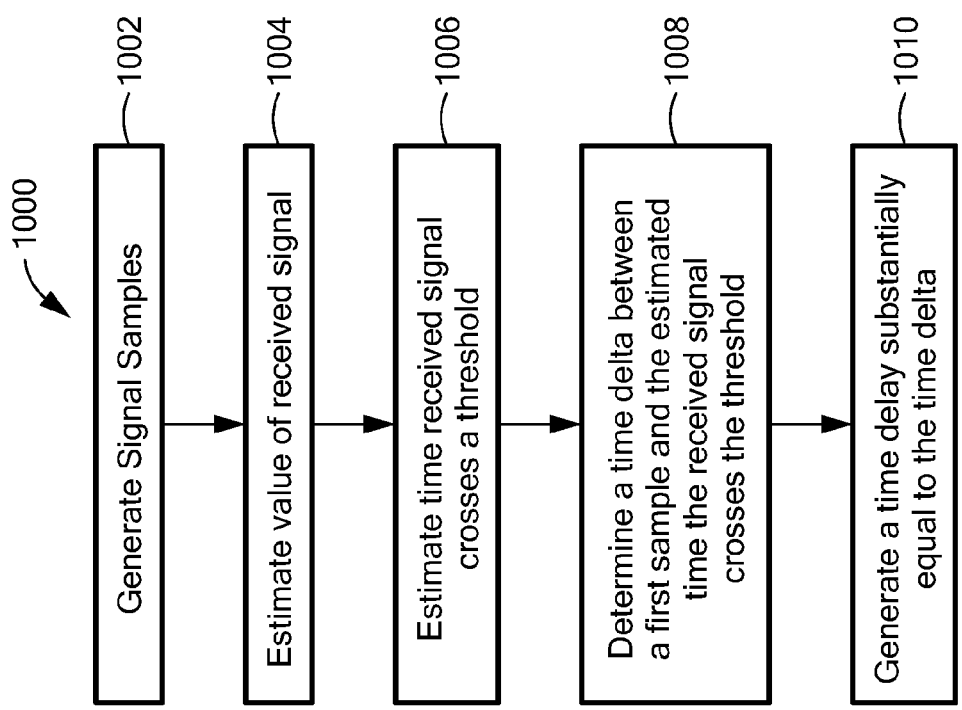
FIG. 10 is a flowchart of a method for generating a delay.

Referring now to FIG. 10, a flowchart illustrates a method 1000 of providing an output delay. In block 1002, samples of a received signal are generated (for example by ADCs 118, 120 in FIG. 1A). In block 1004, values between two (or more) selected samples are estimated. The selected samples are on either side of a threshold, for example, the threshold 404 of FIG. 4. The values may be estimated by interpolation circuit 134, for example. In block 1006, the time at which the received signal crosses a threshold is estimated by using the estimated samples, for example, by processor 124 and/or interpolation circuit 134. In block 1008, a time delta ($T_{DEL}$) between a first sample of the selected samples and the estimated time that the received signal crosses the threshold is determined by, for example, interpolation circuit 136. In block 1010, a time delay (e.g. $T_{DEL}'$) that is substantially equal to the time delta is generated. The time delay may be generated by delay circuit 136, for example.

Figure 11:
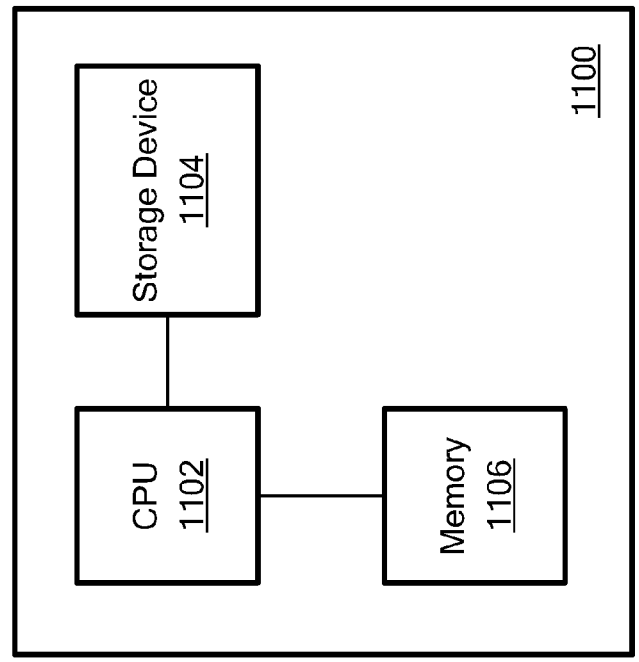
FIG. 11 is a block diagram of an embodiment of a processor circuit.

FIG. 11 is a block diagram of a computational circuit 1100, which can perform at least some of the processing described above. In an embodiment, processor 124 and/or other parts of magnetic field sensor 104 may be implemented, in whole or in part, by computational circuit 1100 or a similar circuit.

Computational circuit 1100 may include a central processing unit (CPU) 1102 coupled to a storage device 1104 and a memory 1106. CPU 1002 can be a general purpose processor, a custom-designed processor, a microprocessor, or any other type of processor or circuit that can execute software instructions.

Storage device 1004 comprises a non-volatile memory such as a ROM, flash memory, F-RAM, solid-state drive, etc. Storage device 1104 may be either read-only or read/write. In other embodiments, storage device 1104 is a hard-drive, DVD, CD, or other type of disc device.

Memory 1106 comprises a volatile memory, such as a RAM. In certain embodiments, RAM 1106 may be omitted from computational circuit 1100.

In operation, CPU 1102 may read and execute software instructions from storage device 1104. When executed, the instructions may cause CPU 1102 to perform functions and operations as described above with respect to processor 124. In certain embodiments, CPU 1102 may copy the instructions from storage device 1104 to memory 1006 prior to executing the instructions. CPU 1102 may also read and write data to and from storage device 1104 and memory 1106. In other embodiments, computational circuit may comprise programmable hardware logic (e.g. a PLA), an FPGA, an ASIC, or any other type of hardware circuit or device capable of performing at least some of the functions described above and/or executing software instructions that cause the computational circuit to perform at least some of the functions described above.

It will be recognized that not all embodiments can be listed in this document and that other embodiments fall within the scope of the claims.

What is claimed is:

1. A system comprising:
    a clock circuit generating a sample clock signal having a predetermined sample clock period;
    a sampling circuit to generate samples of a received signal during each sample clock period;
    an interpolation circuit to:
        estimate at least one value of the received signal at times between the samples of the received signal, the at least one estimated value corresponding to a threshold value and based on at least a first sample and a second sample of the received signal;
        estimate a time that the received signal crosses the threshold by using the estimated values; and
        determine a time delta between the first sample and the estimated time that the received signal crosses the threshold; and
    a delay circuit to generate a time delay substantially equal to the time delta; and
    a synchronization circuit to periodically synchronize the delay circuit so that a maximum delay generated by the delay circuit is substantially equal to the sample clock period, wherein the synchronization circuit comprises a control feedback loop.

2. The system of claim 1 wherein the delay circuit is further configured to generate the time delay during a clock period following the second sample.

3. The system of claim 1 further comprising a circuit to generate a state transition of an output signal after the time delay.

4. The system of claim 1 wherein an output of the delay circuit has a resolution that is a fraction of the clock period.

5. The system of claim 4 wherein the delay circuit has a resolution that is $\frac{1}{2}^x$ times the sample clock period, where x is a non-zero integer.

6. The system of claim 1 wherein delay circuit includes one or more inputs to receive one or more control signals representing the time delay.

7. The system of claim 6 wherein the one or more inputs are digital inputs.

8. The system of claim 6 further comprising a state machine to generate the one or more control signals.

9. The system of claim 1 wherein the discrete time control feedback loop comprises a phase comparator and a variable current source.

10. A magnetic field sensor comprising:
    a clock circuit generating a sample clock signal having a predetermined sample clock period;
    a sampling circuit to generate, during each sample clock period, samples of a magnetic field signal representing an external magnetic field;
    an interpolation circuit to:
        estimate at least one value of the received signal at times between the samples of the received signal, the at least one estimated value corresponding to a threshold value and based on at least a first sample and a second sample of the received signal;
        estimate a time that the received signal crosses the threshold by using the estimated values; and
        determine a time delta between the first sample and the estimated time that the received signal crosses the threshold; and
    a delay circuit to generate a time delay substantially equal to the time delta; and
    a synchronization circuit to periodically synchronize the delay circuit so that a maximum delay generated by the delay circuit is substantially equal to the sample clock period, wherein the synchronization circuit comprises a control feedback loop.

11. The magnetic field sensor of claim 10 wherein the delay circuit is further configured to generate the time delay following a second sample clock period after the first sample clock period.

12. The magnetic field sensor of claim 11 further comprising a circuit to generate a state transition of an output signal after the time delay.

13. The magnetic field sensor of claim 10 wherein the delay circuit has a resolution that is a fraction of the sample clock period.

14. A method comprising:
- generating a sample clock signal having a predetermined sample clock period;
- generating samples of a received signal during each sample clock period to produce a sampled signal;
- estimating at least one value of the received signal at times between the samples of the received signal, the at least one estimated value corresponding to a threshold value and based on at least a first sample and a second sample of the received signal;
- estimating a time that the received signal crosses the threshold;
- determining a time delta between the first sample and the estimated time that the received signal crosses the threshold;
- generating a delayed output signal having a state transition occurring at a time substantially equal to the time delta following the second sample; and
- periodically synchronizing, by a synchronization circuit, the delayed output signal so that a maximum delay of the delayed output signal is substantially equal to the sample clock period wherein the synchronization circuit comprises a control feedback loop.

15. The method of claim 14 further comprising generating the state transition of the delayed output signal during a clock period following the second sample.

16. The method of claim 14 wherein estimating the at least one value includes interpolating a point of the received signal between the first and second samples based on an interpolation function.

17. An apparatus comprising:
- a clock circuit generating a sample clock signal having a predetermined sample clock period;
- a sampling circuit to generate samples of a received signal during each sample clock period;
- an interpolation circuit to:
  - estimate at least one value of the received signal at times between the samples of the received signal, the at least one estimated value corresponding to a threshold value and based on at least a first sample and a second sample of the received signal;
  - estimate a time that the received signal crosses the threshold by using the estimated values; and
  - determine a time delta between the first sample and the estimated time that the received signal crosses the threshold; and
- means for generating a delayed output signal having a state transition during a second sample clock period following the first sample clock period, the delayed output signal being delayed by a time substantially equal to the time delta during a clock period following the second sample; and
- a synchronization circuit to periodically synchronize the delay circuit so that a maximum delay generated by the delay circuit is substantially equal to the sample clock period, wherein the synchronization circuit comprises a control feedback loop.

18. The apparatus of claim 17 wherein the second clock period follows immediately after the first clock period.

* * * * *

UNITED STATES PATENT AND TRADEMARK OFFICE
CERTIFICATE OF CORRECTION

PATENT NO. : 9,797,961 B2  
APPLICATION NO. : 14/599789  
DATED : October 24, 2017  
INVENTOR(S) : Christian Feucht et al.

Page 1 of 1

It is certified that error appears in the above-identified patent and that said Letters Patent is hereby corrected as shown below:

In the Specification

Column 3 Line 56: remove "e" and replace with --type--

Column 7 Line 34: replace "be non-crystal" with --be a non-crystal--

Column 13 Line 5: replace "an" with --as--

Column 13 Line 55: replace "1006" with --1106--

Signed and Sealed this  
First Day of May, 2018

Andrei Iancu  
*Director of the United States Patent and Trademark Office*